(12) United States Patent
Bi et al.

(10) Patent No.: US 7,812,487 B2
(45) Date of Patent: Oct. 12, 2010

(54) CONTROLLER FOR A DIRECT CURRENT BRUSHLESS MOTOR

(75) Inventors: Ronghua Bi, Zhongshan (CN); Maosen Zeng, Zhongshan (CN); Jianwei Jin, Zhongshan (CN); Songfa Tang, Zhongshan (CN)

(73) Assignee: Zhongshan Broad-Ocean Motor Co., Ltd., Zhongshan (CN)

( * ) Notice: Subject to any disclaimer, the term of this patent is extended or adjusted under 35 U.S.C. 154(b) by 39 days.

(21) Appl. No.: 11/754,366

(22) Filed: May 28, 2007

(65) Prior Publication Data

US 2008/0048535 A1    Feb. 28, 2008

(30) Foreign Application Priority Data

Aug. 28, 2006    (CN) .................. 2006 2 0063832

(51) Int. Cl.
| | |
|---|---|
| H02K 1/32 | (2006.01) |
| H02K 5/00 | (2006.01) |
| H02K 3/24 | (2006.01) |
| H02K 5/18 | (2006.01) |
| H02K 5/20 | (2006.01) |
| H02K 9/00 | (2006.01) |

(52) U.S. Cl. .................. 310/64; 310/89; 310/68 D; 310/68 R; 361/696; 361/697; 361/704; 361/705; 361/719; 361/720; 439/91

(58) Field of Classification Search .................. 310/64, 310/89, 68 D, 68 R; 361/696, 697, 704, 705, 361/719, 720; 439/91; H02K 1/32, 5/00, H02K 3/24, 5/18, 5/20, 9/00

See application file for complete search history.

(56) References Cited

U.S. PATENT DOCUMENTS

| 4,668,898 | A | * | 5/1987 | Harms et al. | ........... 318/400.21 |
|---|---|---|---|---|---|
| 5,327,036 | A | * | 7/1994 | Carey | ........................ 310/89 |
| 5,591,034 | A | * | 1/1997 | Ameen et al. | .................. 439/91 |
| 6,031,306 | A | * | 2/2000 | Permuy | ..................... 310/67 R |
| 6,081,056 | A | * | 6/2000 | Takagi et al. | .................... 310/89 |
| 6,092,926 | A | * | 7/2000 | Still et al. | .................... 374/141 |
| 6,117,797 | A | * | 9/2000 | Hembree | ..................... 438/759 |
| 6,392,890 | B1 | * | 5/2002 | Katchmar | ..................... 361/705 |

(Continued)

FOREIGN PATENT DOCUMENTS

WO    WO 2004025812 A1 *    3/2004

*Primary Examiner*—Quyen Leung
*Assistant Examiner*—John K Kim
(74) *Attorney, Agent, or Firm*—Matthias Scholl P.C.; Matthias Scholl

(57) ABSTRACT

Taught herein is a controller for a DC brushless motor comprising a control board (3) and a housing (4); wherein the control board (3) is disposed in the housing (4), and the housing (4) is made of metal materials with good thermal conductivity; a plurality of heat sinks (5) are disposed at the bottom of the housing (4), thereby heat generated by the control board (3) will be dissipated fast, and the operating temperature and failure rates are reduced; an integrated power module chip (7) disposed at the bottom of the control board (3) transfers heat to the housing (4) via an insulating heat sink (8), and in doing so prevents electric leakage; the purpose of a plurality of gaps (9) disposed at the top of the housing (4) is to provide ventilation, and to dissipate heat fast; all of these design characteristics make the invention simple in structure, and convenient for mass assembly.

6 Claims, 5 Drawing Sheets

U.S. PATENT DOCUMENTS

| | | | |
|---|---|---|---|
| 6,483,213 B1 * | 11/2002 | Hsu | 310/68 R |
| 6,529,380 B1 * | 3/2003 | Kono | 361/708 |
| 6,657,338 B2 * | 12/2003 | Fisher et al. | 310/89 |
| 6,700,253 B1 * | 3/2004 | Ohnuma et al. | 310/89 |
| 6,704,201 B2 * | 3/2004 | Kasuga | 361/704 |
| 6,949,849 B1 * | 9/2005 | Wright et al. | 310/89 |
| 7,095,146 B2 * | 8/2006 | Fukazawa et al. | 310/89 |
| 7,375,287 B2 * | 5/2008 | Rathmann | 174/260 |
| 2006/0152907 A1 * | 7/2006 | Rathmann | 361/720 |
| 2007/0086170 A1 * | 4/2007 | Liang | 361/719 |
| 2007/0103101 A1 * | 5/2007 | Kikuchi et al. | 318/140 |
| 2008/0048535 A1 * | 2/2008 | Bi et al. | 310/68 R |

* cited by examiner

CONTROLLER FOR A DIRECT CURRENT BRUSHLESS MOTOR

CROSS-REFERENCE TO RELATED APPLICATIONS

This application claims priority to Chinese Patent Application No. 200620063832.9 filed on Aug. 28, 2006, the contents of which are incorporated herein by reference.

BACKGROUND OF THE INVENTION

1. Field of the Invention

The invention relates to a controller, and more particularly to a controller for a DC brushless motor.

2. Description of the Related Art

Conventional direct current (DC) brushless motors include two parts: the motor itself and a controller. The motor includes a stator, a permanent magnetic rotor magnetically coupled to the stator, a shell for supporting the stator and the permanent magnetic rotor, and an end shield disposed at the top of the housing. The controller includes a control board and a housing.

Typically, the main operating circuit of the controller generates a large amount of heat and the control board operates at a high temperature often causing electronic components of the controller to burn or fail. Moreover, the connection structure between the housing of the controller and the motor is not convenient enough and not optimized for mass assembly.

SUMMARY OF THE INVENTION

In view of the above-described problems, it is one objective of the invention to provide a controller for a DC brushless motor that efficiently dissipates heat generated thereby, and has a simple structure for a convenient assembly.

To achieve the above objectives, in accordance with one embodiment of the invention, provided is a controller for a DC brushless motor, comprising a control board and a housing. The control board is disposed in the housing, and the housing is made of a metal or a metallic material having good thermal conductivity.

In certain classes of this embodiment, a plurality of cooling fins is disposed at the bottom of the housing.

In certain classes of this embodiment, the cooling fins are parallel to each other.

In certain classes of this embodiment, the cooling fins extend to an inner side wall of the housing.

In certain classes of this embodiment, a plurality of juts for supporting the control board protrudes from the inner side wall of the housing.

In certain classes of this embodiment, an integrated power module chip for driving the motor is disposed at the bottom of the control board.

In certain classes of this embodiment, an insulating heat sink disposed between the integrated power module chip and the inner bottom wall of the housing.

In certain classes of this embodiment, the heat sink is made of a silicon rubber.

In certain classes of this embodiment, a plurality of gaps is disposed at the top of the housing.

In certain classes of this embodiment, the gaps are for receiving a plurality of screw heads sticking out of a bottom wall of the motor.

In certain classes of this embodiment, a pair of protrusions is disposed at two opposite sides of the top of the housing.

In certain classes of this embodiment, a pair of holes is disposed in the protrusions.

In certain classes of this embodiment, the housing is fixed at the bottom of the motor via a pair of screws passing through the holes.

In certain classes of this embodiment, the housing is made of an aluminum alloy material.

The invention has the following advantages over the prior art. 1) The housing of the controller is made of metal materials with good thermal conductivity, and a plurality of heat sinks is disposed at the bottom of the housing to enlarge the heat dissipation area. Thereby heat generated by the control board will be dissipated fast, and the operating temperature and failure rates thereof are reduced. 2) The heat sink disposed between the integrated power module chip (which generates most of the heat) and the bottom wall of the housing rapidly transfers the heat to the housing, and it prevents electrical leakage of the chip. 3) The gaps disposed at the top of the housing have a ventilating function and quicken heat dissipation. 4) The protrusions are disposed at both sides of the top of the housing, and the housing is fixed at the bottom of the DC brushless motor via a pair of screws passing through the holes of protrusions. All of these characteristics make embodiments of the invention simple in structure and convenient for mass assembly.

BRIEF DESCRIPTION OF THE DRAWINGS

The objects and advantages of the invention will become more readily apparent after reading the ensuing descriptions of the non-limiting illustrative embodiment and viewing the accompanying drawings, in which.

DETAILED DESCRIPTION OF THE INVENTION

Figure 1:
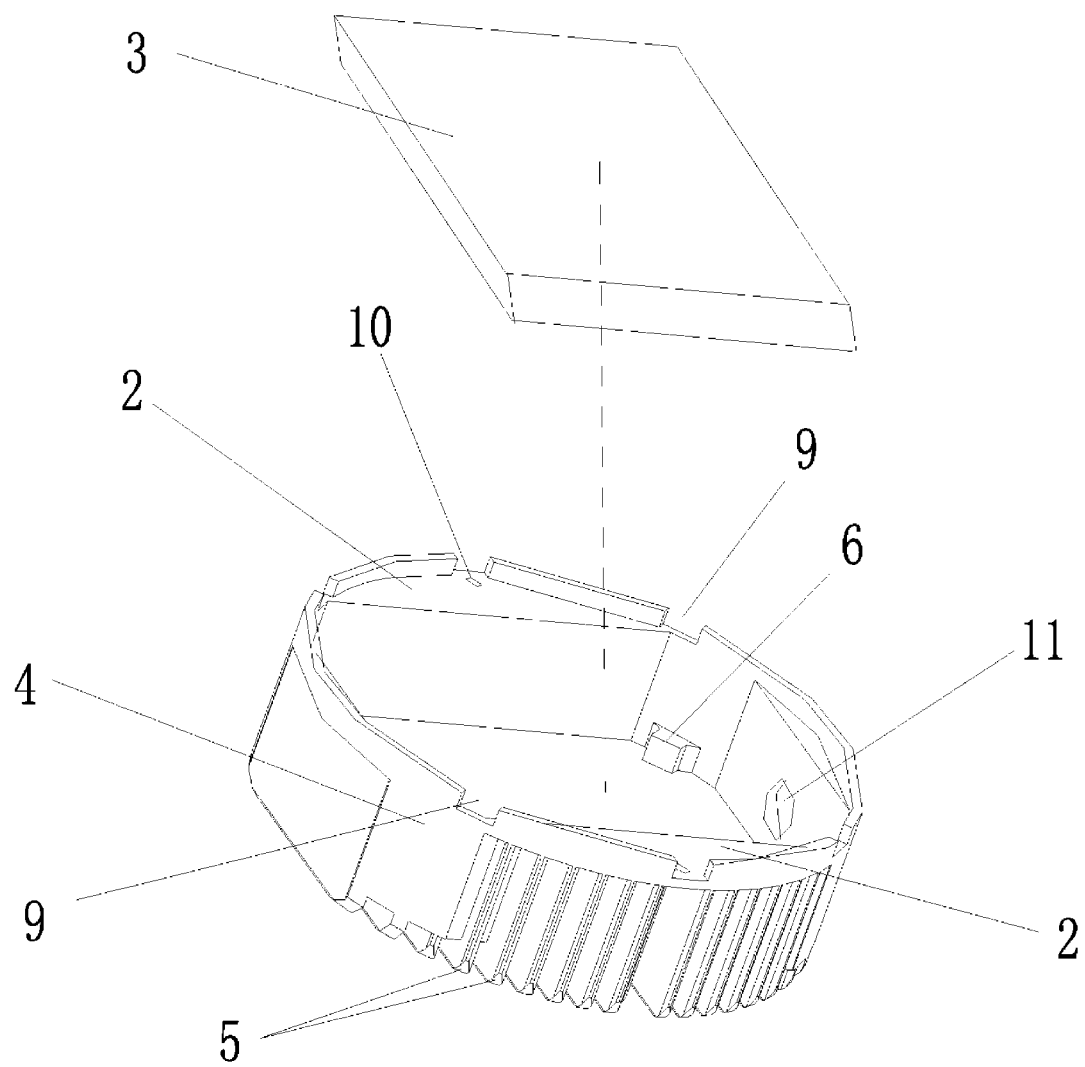
FIG. 1 is an exploded view of a controller for a DC brushless motor according to one embodiment of the invention.
Figure 2:
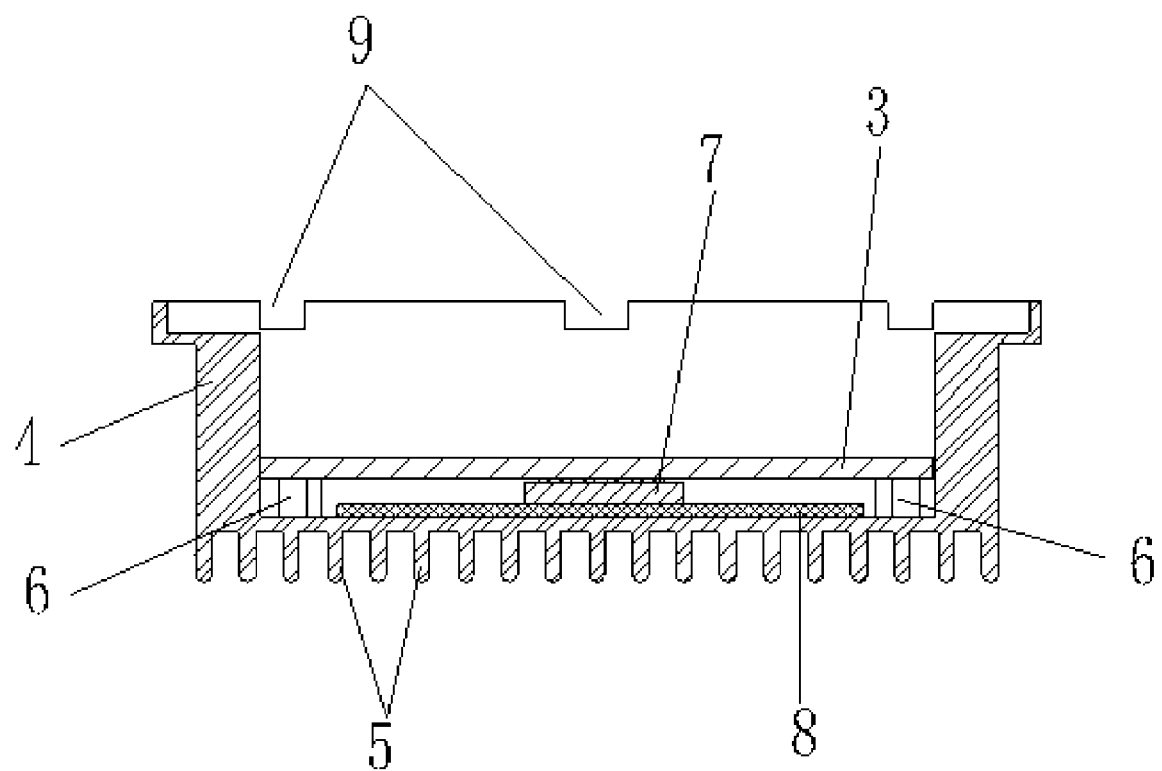
FIG. 2 is a cross-sectional view thereof.
Figure 3:
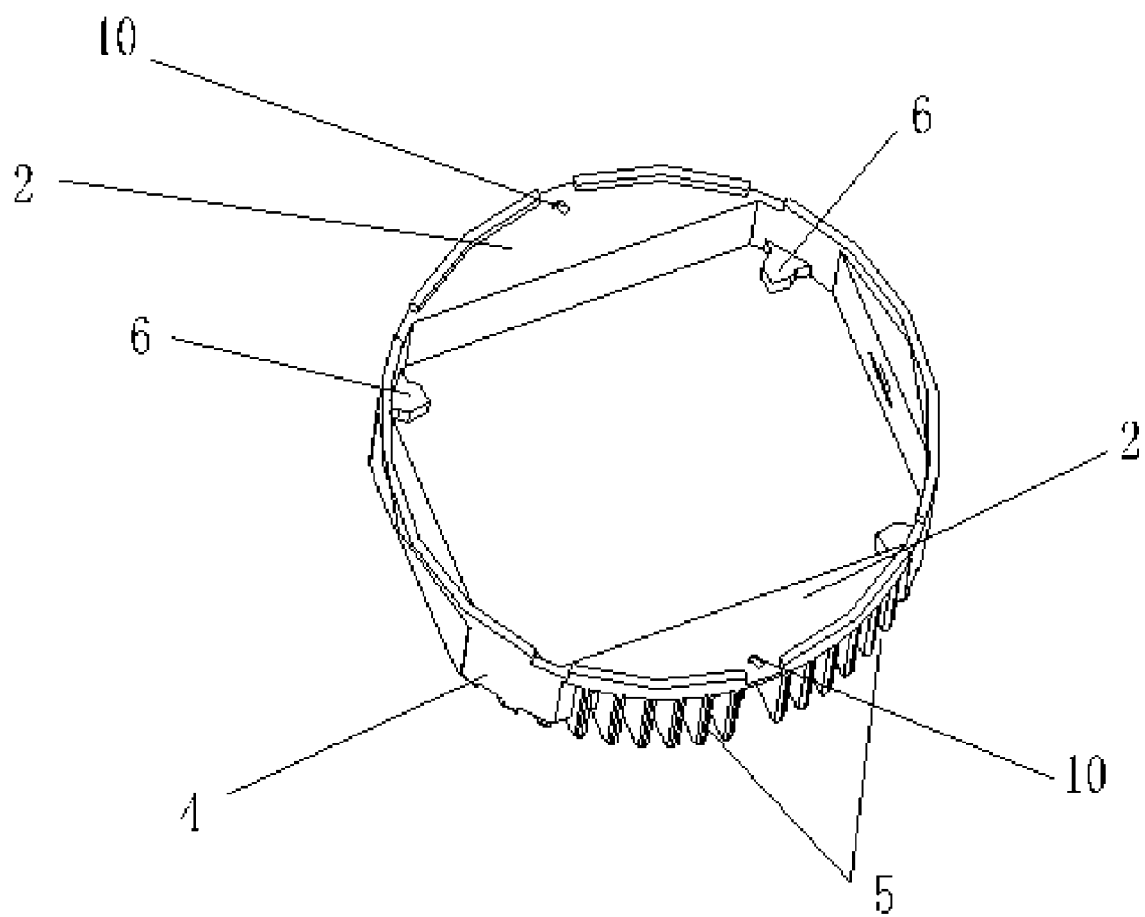
FIG. 3 is a perspective view of the housing 4 viewed from a first angle.
Figure 4:
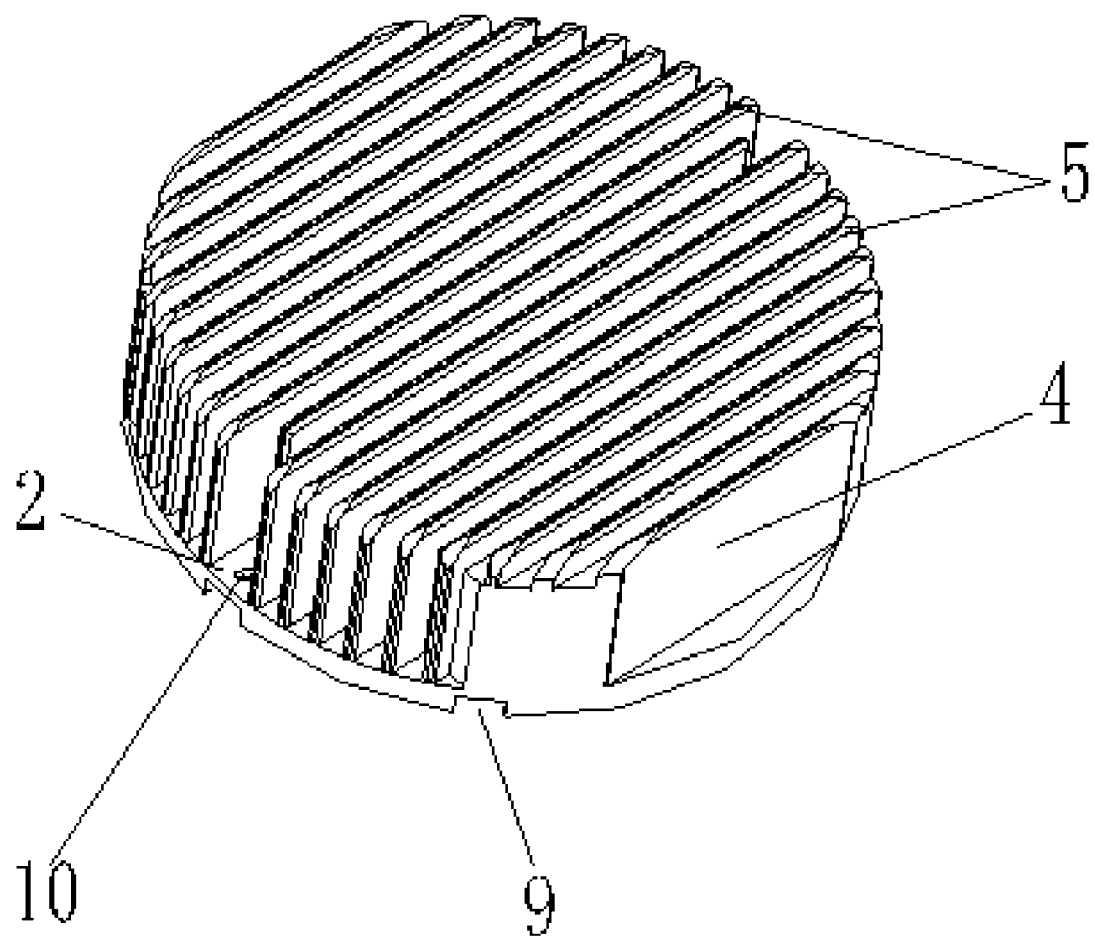
FIG. 4 is a perspective view of the housing 4 viewed from a second angle.
Figure 5:
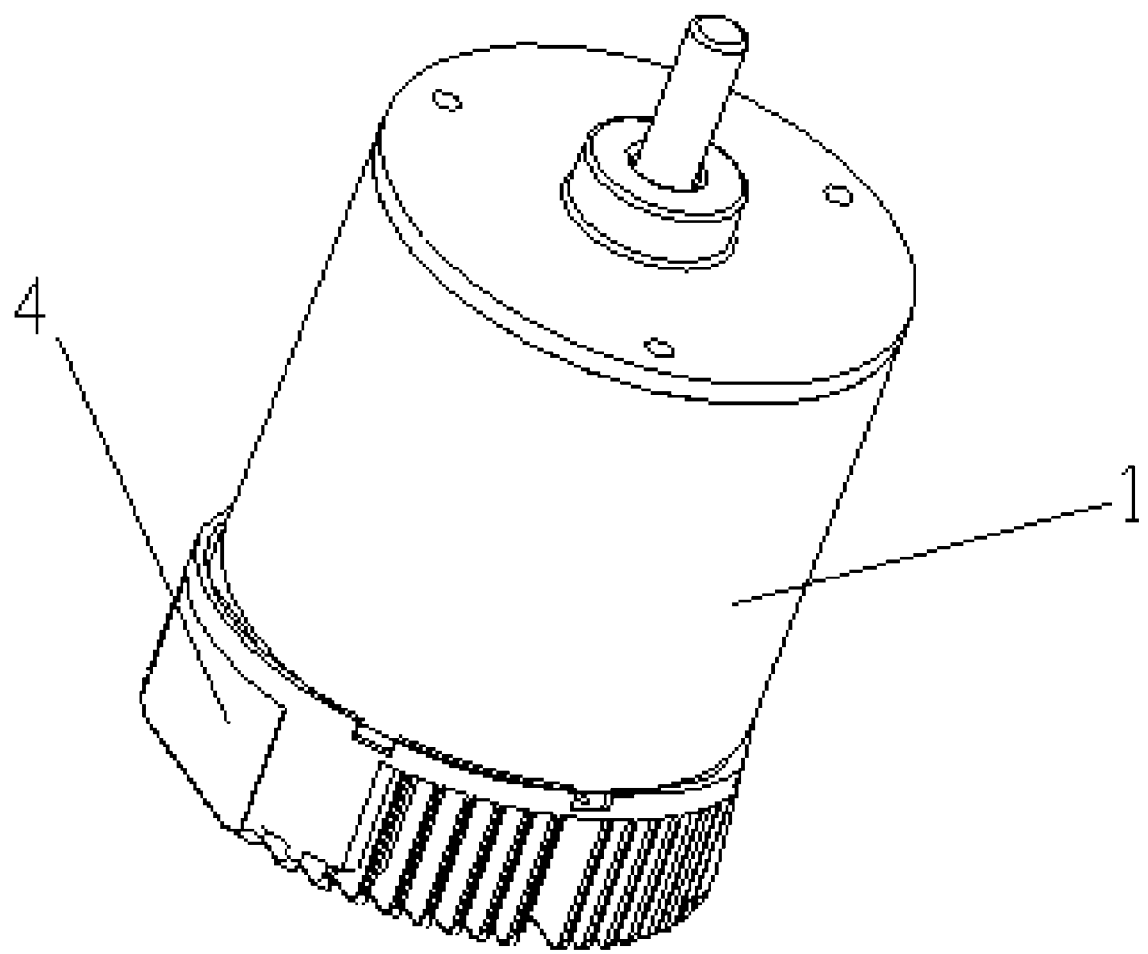
FIG. 5 is a perspective view of a controller for a DC brushless motor installed on the DC brushless motor.

As shown in FIGS. 1-3, a controller for a DC brushless motor comprises a control board 3 and a housing 4. The control board 3 is disposed in the housing 4. The housing 4 is made of a metal material with good thermal conductivity, e.g., without limitation, an aluminum alloy material.

A plurality of cooling fins 5, parallel to one another, are disposed at the bottom of the housing 4, and a plurality thereof extend to a side wall the housing 4 so as to maximize the heat dissipation area.

A jut 6 protrudes from an inner bottom wall of the housing 4 so as to support the control board 3.

An integrated power module chip 7 for driving the motor is disposed at the bottom of the control board 3. An insulating heat sink 8 made of silicon rubber is disposed between the integrated power module chip 7 and the inner bottom wall of the housing 4.

A plurality of gaps 9 is disposed at the top of the housing 4, so as to receive a plurality of screw heads sticking out of a bottom wall of the motor. A pair of protrusions 2 is disposed one at each of two opposite sides at the top of the housing 4.

A pair of holes 10 is disposed on the protrusions 2. The housing 4 is fixed at the bottom of the DC brushless motor 1 via a pair of screws passing through the holes 10. A through hole 11 for passing a control cable is disposed in a side wall of the housing 4.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

What is claimed is:

1. A controller for a direct current brushless motor (1), comprising
   a control board (3) having a top portion and a bottom portion;
   a housing (4) having an inner side wall, an outer side wall, a top, and a bottom inner wall;
   a plurality of juts (6) for supporting said control board (3);
   a plurality of cooling fins (5);
   an integrated power module chip (7) for driving the motor; and
   an insulating heat sink (8);
   wherein
   said outer sidewall is substantially circular in shape; said control board is rectangular in shape; said inner side wall is substantially rectangular in shape having four corners; said juts (6) protrude one from each corner of the inner side wall; said control board (3) is disposed in said housing (4) and rests on said juts (6), said cooling fins (5) are disposed at the bottom of said housing (4), said integrated power module chip (7) is disposed at said bottom portion of said control board, and said insulating heat sink (8) is disposed between said integrated power module chip (7) and said inner bottom wall of said housing (4).

2. The controller of claim 1, wherein said housing (4) is made of a heat-conducting material.

3. The controller of claim 1, wherein said heat sink (8) is made of silicon rubber.

4. A controller for a direct current brushless motor (1), comprising
   a control board (3) having a top portion and a bottom portion;
   a housing (4) having an inner side wall, an outer side wall, a top, and a bottom inner wall;
   a plurality of cooling fins (5);
   an integrated power module chip (7) for driving the motor;
   an insulating heat sink (8); and
   a plurality of juts (6) for supporting said control board (3);
   wherein
   said outer sidewall is substantially circular in shape; said control board is rectangular in shape; said inner side wall is substantially rectangular in shape having four corners; said juts (6) protrude one from each corner of the inner side wall; said control board (3) is disposed in said housing (4), said cooling fins (5) are disposed at the bottom of said housing (4), said integrated power module chip (7) is disposed at said bottom portion of said control board, said insulating heat sink (8) is disposed between said integrated power module chip (7) and said inner bottom wall of said housing (4), said juts (6) protrude from said inner side wall of said housing (4), and said control board (3) is supported on said juts (6).

5. The controller of claim 4, wherein a pair of protrusions (2) is disposed at two opposite sides of said top of said housing (4), and said protrusions (2) are made of aluminum alloy material.

6. The controller of claim 5, wherein said protrusions (2) are adapted to tightly receive said control board (3) and simultaneously to absorb heat dissipating from said control board (3).

\* \* \* \* \*